United States Patent

Nara

(10) Patent No.: US 8,883,577 B2
(45) Date of Patent: Nov. 11, 2014

(54) SEMICONDUCTOR DEVICE AND PRODUCING METHOD THEREOF

(75) Inventor: Yasuo Nara, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/639,561

(22) Filed: Dec. 16, 2009

(65) Prior Publication Data

US 2010/0167475 A1    Jul. 1, 2010

(30) Foreign Application Priority Data

Dec. 26, 2008    (JP) ................................. 2008-331992

(51) Int. Cl.
- *H01L 21/00* (2006.01)
- *H01L 21/84* (2006.01)
- *H01L 29/66* (2006.01)
- *H01L 29/78* (2006.01)
- *H01L 21/8238* (2006.01)

(52) U.S. Cl.
CPC ... *H01L 29/66545* (2013.01); *H01L 21/823821* (2013.01); *H01L 29/66795* (2013.01); *H01L 29/785* (2013.01)
USPC .................................. 438/157; 257/E21.421

(58) Field of Classification Search
CPC ..................... H01L 21/823821; H01L 29/785; H01L 29/66795; H01L 29/665453
USPC .......................................... 438/156, 286, 157
See application file for complete search history.

(56) References Cited

U.S. PATENT DOCUMENTS

| | | | |
|---|---|---|---|
| 6,764,884 B1 | 7/2004 | Yu et al. | |
| 7,015,534 B2 * | 3/2006 | Colombo | 257/314 |
| 7,268,396 B2 | 9/2007 | Lee et al. | |
| 2005/0104096 A1 | 5/2005 | Lee et al. | |
| 2006/0172497 A1 * | 8/2006 | Hareland et al. | 438/286 |
| 2006/0175669 A1 * | 8/2006 | Kim et al. | 257/401 |
| 2009/0134454 A1 | 5/2009 | Takeuchi et al. | |

FOREIGN PATENT DOCUMENTS

| | | |
|---|---|---|
| JP | 2002-289871 A | 10/2002 |
| JP | 2004-356472 A | 12/2004 |
| JP | 2005-150742 A | 6/2005 |
| JP | 2006-522486 A | 9/2006 |
| WO | 2006/132172 A1 | 12/2006 |

OTHER PUBLICATIONS

Japanese Office Action dated Jul. 2, 2013, issued in Japanese Patent application No. 2008-331992, w/English translation.

* cited by examiner

*Primary Examiner* — Leonard Chang
(74) *Attorney, Agent, or Firm* — Westerman, Hattori, Daniels & Adrian, LLP (57) ABSTRACT

A semiconductor device manufacturing method includes forming a fin region over a substrate, forming a dummy gate electrode over the fin region, forming a first insulating film over the dummy gate electrode and the fin region, polishing the first insulating film until the dummy gate electrode is exposed, removing part of the exposed dummy gate electrode to form a trench, forming a gate insulator over the surface of the fin region exposed in the trench, and forming a gate electrode over the gate insulator.

9 Claims, 11 Drawing Sheets

SEMICONDUCTOR DEVICE AND PRODUCING METHOD THEREOF

CROSS-REFERENCE TO RELATED APPLICATIONS

This application is based upon and claims the benefit of priority from the prior Japanese Patent Application No. 2008-331992, filed on Dec. 26, 2008, the entire contents of which is incorporated herein by reference.

FIELD

The present invention relates to a semiconductor device and a manufacturing method thereof.

BACKGROUND

A field effect transistor having a fin structure (fin FET) is actively being developed. The fin FET has a fin-like projection perpendicular to a substrate surface, a gate insulator and a gate electrode are formed on both side surfaces of the fin-like projection, and source/drain regions are formed on both sides of the gate.

In the fin FET, a channel surface is disposed perpendicular to the substrate surface, so that an occupied area may be reduced on the substrate. A cap layer is provided over a silicon layer of a Semiconductor On Insulator (SOI) substrate, and is patterned to form a silicon fin. The cap layer includes an oxide film or a lamination of the oxide film and a nitride film. In the SOI substrate, the silicon layer is disposed over an insulating film. After the gate insulator made of oxide silicon or nitride oxide silicon is formed over a fin surface, a polysilicon layer is deposited and patterned, and a gate electrode is formed. The fin regions on both sides of the gate electrode are doped to form a source/drain region.

Figure 5:
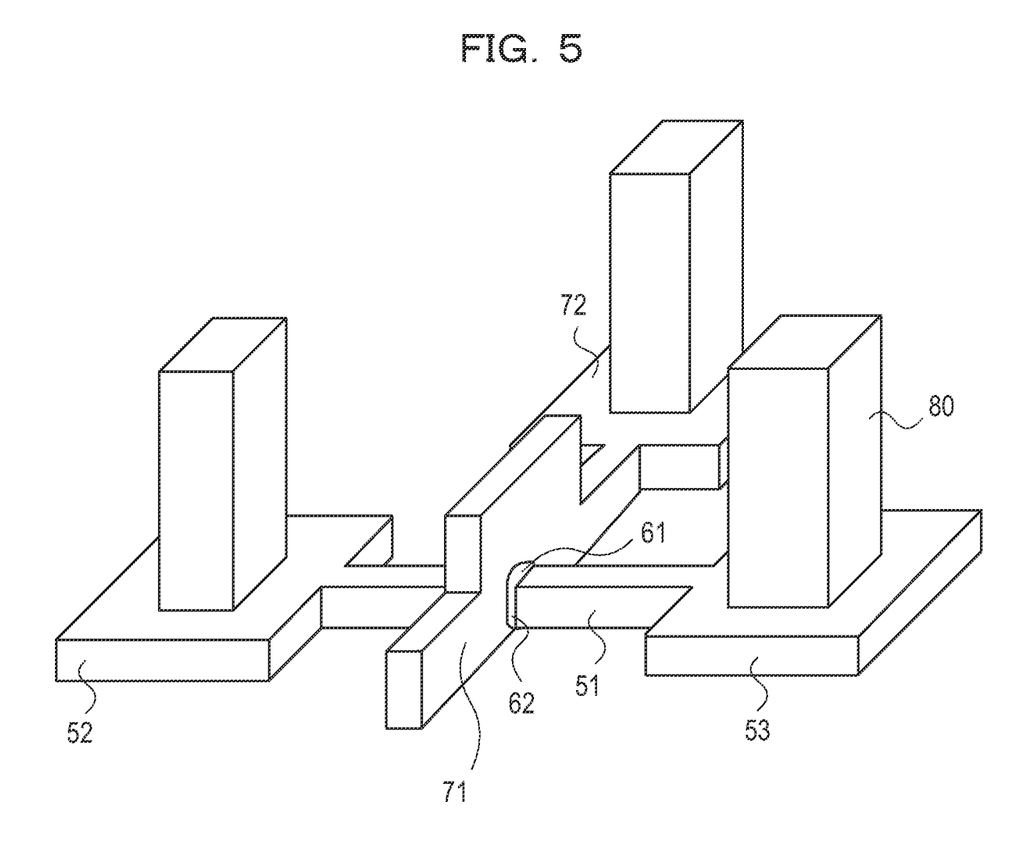
FIG. 5 is a perspective view illustrating a fin FET in the related art.

FIG. 5 illustrates a configuration example of the fin FET. In FIG. 5, the silicon layer of the SOI substrate is patterned to form a fin 51 and contact regions 52 and 53. A cap layer 61 is left over the silicon layer. The oxide film or the nitride film is formed as a gate insulator 62 in the fin sidewall. A gate electrode 71 is formed so as to stride over the fin 51. A contact region 72 is formed in an end portion of the gate electrode 71. An impurity is added to the fin 51 by ion implantation to form the source/drain region. After a transistor structure is covered with an interlayer insulator, a contact hole reaching the contact regions 52 and 53 is made, and a conductive plug 80 such as a tungsten plug is made in the contact hole. The gate electrode 71 may be formed by laminating a polysilicon layer and a silicide layer, or may be formed by a metallic layer.

A channel of the fin FET is formed in the side surface of the fin. A channel length is determined by a width of the gate electrode. A channel width is determined by a fin height. For example, a fin length is determined by process accuracy. A narrow lead-out portion of the source/drain easily increases resistance of the source/drain. In another proposal, the fin is cut without extending an end portion thereof, and a metallic layer is embedded to form a Schottky contact.

When an opposite area between the gate electrode 71 and a semiconductor substrate disposed below the insulating film in the SOI substrate is enlarged, a parasitic capacitance of the gate electrode is increased which interrupts high-speed operation. In order to decrease the parasitic capacitance of the gate electrode, it is desirable to reduce the opposite area between the semiconductor substrate and the gate electrode.

There is also proposed a configuration in which the opposite area of the gate electrode is reduced with respect to the semiconductor substrate. In this method, an Si layer of the SOI substrate is etched with a hard mask to form the fin. After an oxide film liner and a nitride film liner are formed over the hard mask and the fin, the oxide film liner and the nitride film liner are covered with an insulating film. Chemical Mechanical Polishing (CMP) is performed to the insulating film until the nitride film liner is exposed, the insulating film is partially etched, and an upper surface of the insulating film is lowered below the nitride film liner. While an opposite portion of the substrate is left, the oxide film liner and the nitride film liner are etched to form a trench, a gate insulator is formed in the exposed Si fin surface, and a polysilicon gate electrode layer is embedded in the trench. The hard mask is exposed by CMP. The polysilicon gate electrode layer is left on the insulating film. A metal gate electrode layer is formed, and a gate etching mask is formed thereon. The metal gate electrode layer and the polysilicon gate electrode layer are etched with the gate etching mask to pattern the gate electrode. The ion implantation of the impurity is performed to the polysilicon gate electrode layer with a space interposed between the fin and the insulating film. The space is formed by the etching.

For example, Japanese Laid-Open Patent Publication Nos. 2002-289871 and 2005-150742 disclose a technique concerning the fin FET.

SUMMARY

According to an aspect of the invention, a semiconductor device manufacturing method includes forming a fin region over a substrate, forming a dummy gate electrode over the fin region, forming a first insulating film over the dummy gate electrode and the fin region, polishing the first insulating film until the dummy gate electrode is exposed, removing part of the exposed dummy gate electrode to form a trench, forming a gate insulator on the surface of the fin region exposed in the trench, and forming a gate electrode over the gate insulator.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIGS. 1AP to 1HP are plan views illustrating a fin FET producing method according to a first embodiment of the invention, FIGS. 1AX to 1HX are sectional views of a fin FET taken on a line X-X of FIG. 1AP, and FIGS. 1AY to 1HY are sectional views of the fin FET taken on a line Y-Y of FIG. 1AP;

FIGS. 3AP to 3HP are plan views illustrating a fin FET producing method according to a second embodiment of the invention, FIGS. 3AX to 3HX are sectional views of a fin FET taken on a line X-X of FIG. 3AP, and FIGS. 3AY to 3HY are sectional views of the fin FET taken on a line Y-Y of FIG. 3AP;

DESCRIPTION OF EMBODIMENTS

Figure 1:
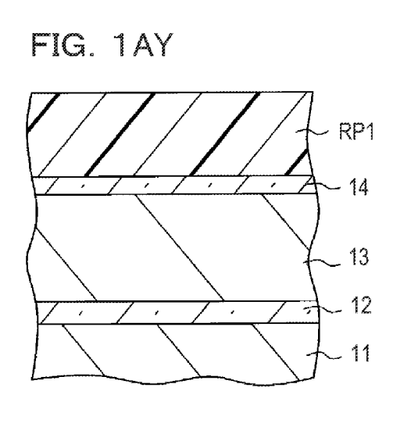

FIGS. 1AP to 1HP are plan views illustrating a fin FET producing method according to a first embodiment of the invention, FIGS. 1AX to 1HX are sectional views of a fin FET taken on a line X-X of FIG. 1AP, and FIGS. 1AY to 1HY are sectional views of the fin FET taken on a line Y-Y of FIG. 1AP.

The case in which an n-type MOSFET is formed using an SOI substrate will be described by way of example. In the SOI substrate, an oxide silicon layer 12 is disposed over a support semiconductor substrate 11 having a flat surface, and a p-type silicon layer 13 is disposed over the oxide silicon layer 12. The case in which a thickness of the silicon layer 13 is matched with a fin height of 40 nm to 60 nm will be described as an example.

As illustrated in FIGS. 1AP, 1AX, and 1AY, an oxide silicon film 14 having a thickness of about 20 nm to about 50 nm is formed over the p-type silicon layer 13 by thermal oxidation or thermal CVD. The oxide silicon layer 14 acts as a hard mask in etching and then acts as a cap layer of a fin region. A resist pattern RP1 that defines a planar shape of a fin region is formed over the cap layer 14 by photolithography or electron beam lithography. For example, the resist pattern RP1 defines a width of 20 nm to 30 nm and a length of several hundred nanometers in the fin region. The dimensions of the fin region are not limited to the embodiment.

For the SOI-type MOSFET having the planar structure, although the optimum fin width depends slightly on an impurity concentration, MOSFET exhibits a full depletion operation when a channel thickness is equal to or lower than one-third of a gate length, and MOSFET exhibits a partially depletion operation when the channel thickness is more than one-third of the gate length. Suitably the full depletion operation suppresses short channel effect and decreases an off-leakage current of a transistor to reduce power consumption. For the full depletion operation, preferably the channel thickness is equal to or thinner than 10 nm when the channel length is 30 nm. In the fin FET, because the channels are formed on both the side surfaces of the fin region, the width of the fin region becomes double the channel thickness. That is, MOSFET exhibits the partially depletion operation when the width of the fin region is more than two-thirds of the gate length. For the gate length of 45 nm, the full depletion operation is performed when the width of the fin region is equal to or narrower than 30 nm. For the gate length of 30 nm, the full depletion operation is performed when the width of the fin region is equal to or narrower than 20 nm.

Figure 2A:
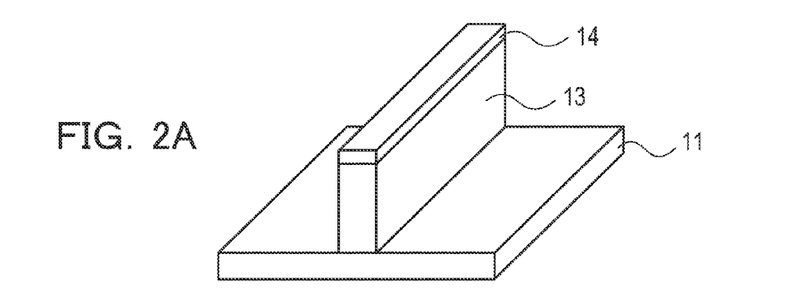
FIGS. 2A to 2D are perspective views illustrating a semiconductor device in the producing method of the first embodiment.

The cap layer is patterned by Reactive Ion Etching (RIE) with the resist pattern RP1 as an etching mask and a mixed gas of $C_4F_6/CO/Ar/O_2$ as an etchant, and the silicon layer is patterned by RIE with a mixed gas of $HBr/O_2$ as an etchant, thereby forming the fin region 13. The resist pattern RP1 may be removed after the hard mask is formed, may be eliminated during the etching, or may be removed after the etching. FIG. 2A illustrates the patterned fin region 13. An upper surface of the fin region 13 is covered with the cap layer 14.

As illustrated in FIGS. 1BP, 1BX, and 1BY, a dummy gate electrode layer is deposited over the substrate while the fin region 13 is covered therewith, and the dummy gate electrode layer is patterned with a resist pattern. The dummy gate electrode layer is made of an insulating material having an etching characteristic different from that of the cap layer. For example, a nitride silicon film 16 having a thickness of about 20 nm to about 50 nm is isotropically deposited by thermal CVD with dichlorosilane and ammonia as a source gas. A resist pattern RP2 is formed over the nitride silicon film 16 so as to traverse the fin region 13. The planar shape of the resist pattern RP2 defines the planar shape of the dummy gate electrode. The width of the resist pattern RP2 defines the channel length. For example, the width of the resist pattern RP2 ranges from 30 nm to 45 nm. There is no particular limitation as long as the length of the resist pattern RP2 is more than the width of the fin region.

Figure 2B:
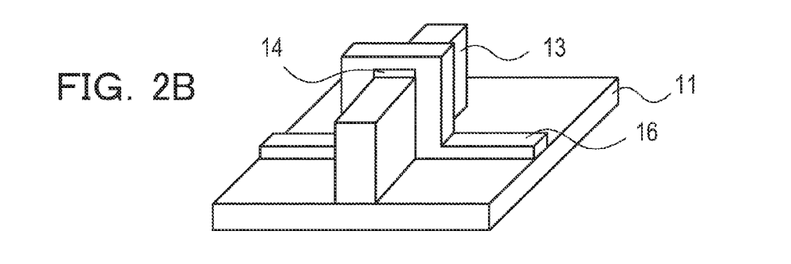

The nitride silicon film 16 is patterned to form the dummy gate electrode 16 by RIE with the resist pattern RP2 as the mask and the mixed gas of $CH_2F_2/Ar/O_2$ as the etchant. The etchant gas may be changed and the cap layer 14 made of oxide silicon is patterned. Then the resist pattern RP2 is removed. FIG. 2B illustrates the state in which the resist pattern RP2 is removed. The dummy gate electrode 16 is formed so as to traverse the side surface of the fin region 13 and the side surface and upper surface of the cap layer 14.

As illustrated in FIGS. 1CP, 1CX, and 1CY, ion implantation is performed to the fin region 13 to form an extension region Ext. For the n-type MOSFET, for example, As, an n-type impurity, is implanted with acceleration energy of 4 keV, a dose amount of $1 \times 10^{15}/cm^2$, and from plural directions of 10 degrees to 20 degrees relative to an implantation angle line normal to the substrate. Because the upper surface of the fin region 13 is covered with the cap layer 14 made of oxide silicon, the impurity is implanted into the side surface of the fin region 13. For the p-type MOSFET, B that is a p-type impurity is implanted with the acceleration energy of 0.6 keV and the dose amount of $1 \times 10^{15}/cm^2$. It is not always necessary to form the extension region.

As illustrated in FIGS. 1DP, 1DX, and 1DY, the sidewall spacer 18 is formed. For example, an oxide silicon film having the thickness of about 5 nm to about 20 nm is deposited by the thermal CVD with silane and oxygen as a source gas, and anisotropic etching is performed by RIE with the mixed gas of $C_4F_6/CO/Ar/O_2$ as the etchant. A sidewall spacer 18 is formed on the side surface of the dummy gate electrode 16 of FIG. 1DP and the side surface of the fin region 13. The formation of the sidewall spacer is omitted when the formation of the extension region is omitted.

Ion implantation is performed to a low-resistance diffusion region Dif of the source/drain region. For the n-type MOSFET, for example, As, an n-type impurity is implanted with the acceleration energy of 25 keV, the dose amount of $5 \times 10^{15}/cm^2$, and from the implantation angles of 10 degrees to 20 degrees. For the p-type MOSFET, $BF_2$, a p-type impurity, is implanted with the acceleration energy of 15 keV, the dose amount of $3 \times 10^{15}/cm^2$ to $5 \times 10^{15}/cm^2$, and from implantation angles of 10 degrees to 20 degrees. After the ion implantation, spike annealing is performed at a temperature range of 1000° C. to 1100° C., for example, at 1050° C. to activate the impurity.

As necessary, a metallic layer such as Ni and Co that may generate the silicide reaction is deposited over the substrate, and an annealing treatment is performed to form a silicide layer SL on a silicon surface. For NiSi, an annealing temperature is about 450° C. The silicide layer SL is formed on the upper surface of the source/drain region in the fin region. The silicide layer SL is not formed on the side surface of the source/drain region covered with the sidewall spacer 18.

Figure 2C:
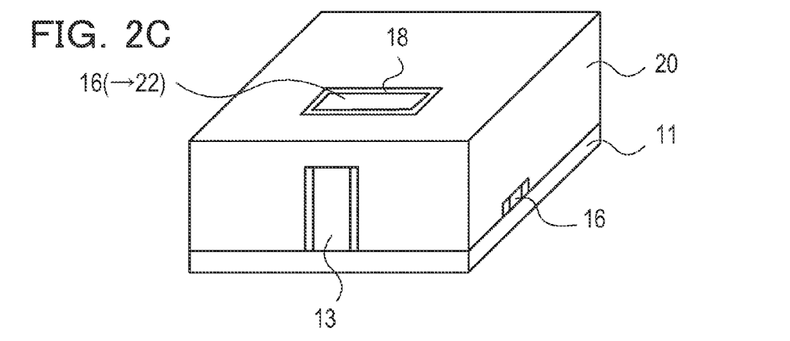

As illustrated in FIGS. 1EP, 1EX, and 1EY, an insulating film 20 such as an oxide silicon film is deposited over the entire substrate, the surface of the insulating film 20 is planarized by CMP, and a top portion of the dummy gate electrode 16 is exposed. FIG. 2C illustrates the state after CMP. The dummy gate electrode 16 surrounded by the sidewall spacer 18 is exposed in the surface of the insulating film 20.

As illustrated in FIGS. 1FP, 1FX, and 1FY, the dummy gate electrode 16 made of nitride silicon is etched using hot phosphoric acid. The etching is ended such that the bottom portion of the dummy gate electrode 16 is left. A trench T is formed so as to be extended in a depth direction from the surface of the insulating film 20. The fin region covered with the dummy gate electrode 16 is exposed in the trench T. The side surfaces of the trench T are surrounded by the sidewall spacer 18 and the fin region 13.

As illustrated in FIGS. 1GP, 1GX, and 1GY, an oxide silicon film having a thickness of about 0.5 nm to about 0.7 nm is formed on the exposed surface of the fin region 13 at a substrate temperature of about 270° C. by an oxidation treatment using ozone ($O_3$). Then an insulating film is deposited. For example, a mixed gas of tetra tert-butoxy hafnium (HTB, Hf (t-$OC_4H_9$)$_4$) and $Si_2H_6$ is caused to flow at a substrate temperature of about 270° C. to deposit a HfSiO film having a thickness of about 1.5 nm to about 2.0 nm. A HfSiON film may be formed by performing nitriding in nitrogen gas plasma. A gate insulator 21 is formed by laminating the oxide silicon film and the insulating film. A $HfO_2$ film, a HfAlO film, a HfAlON film, a $LaO_2$ film, a LaSiO film, or a LaAlO film may be formed as the insulating film instead of the HfSiO film and the HfSiON film.

A TiN film and a W film are deposited over the gate insulator 21 by sputtering to form a gate electrode 22. The TiN film is formed by the sputtering with a Ti target in an atmosphere of a mixed gas of Ar and $N_2$ so as to have the thickness of about 5 nm to about 30 nm. The W film having the thickness of about 10 nm to about 50 nm is formed by the sputtering with a W target in an Ar atmosphere so as to fill the trench T therewith. The gate electrode may be formed using one of the TiN film and the W film. The unnecessary metallic layer over the insulating film 20 is removed by CMP. Therefore, a gate electrode structure G is formed by laminating the gate insulator 21 and the gate electrode 22. FIG. 2C illustrates the state in which the gate electrode structure G is formed.

Figure 2D:
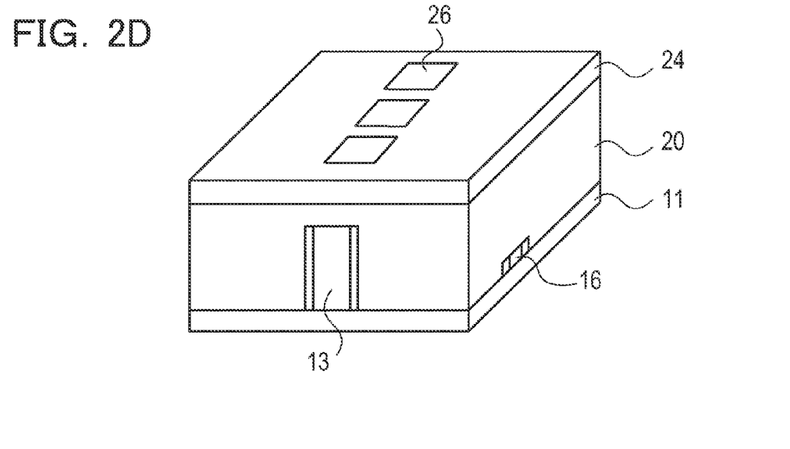

As illustrated in FIGS. 1HP, 1HX, and 1HY, an interlayer insulator 24 such as oxide silicon film is deposited over the substrate, a contact hole is etched to expose the gate electrode 22 and the surface of the source/drain region S/D, and a conductive plug 26 is embedded. For example, the conductive plug is formed by laminating the TiN film and the W film. FIG. 2D illustrates the state in which the conductive plug 26 is formed.

In the first embodiment, the dummy gate electrode having the same shape as the gate electrode structure is formed in the fin surface to form the source/drain region. After the interlayer insulator with which the dummy gate electrode is covered is formed, the dummy gate electrode is removed, and the trench T is embedded to form the gate electrode structure, so that the gate electrode structure may be obtained with high accuracy.

Figure 3:
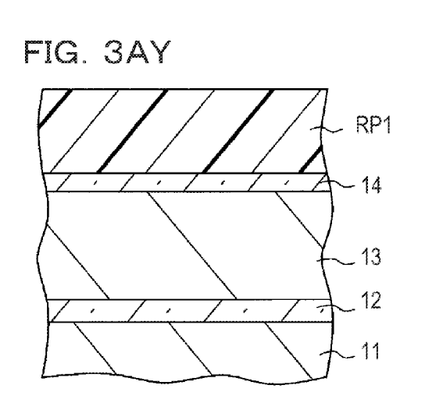

FIGS. 3AP to 3HP are plan views of an SOI substrate illustrating a fin FET producing method according to a second embodiment of the invention, FIGS. 3AX to 3HX are sectional views of a fin FET taken on a line X-X of FIG. 3AP, and FIGS. 3AY to 3HY are sectional views of the fin FET taken on a line Y-Y of FIG. 3AP.

As illustrated in FIGS. 3AP, 3AX, and 3AY, the fin region 13 having the cap layer 14 is formed using the resist pattern RP1. The description of the process similar to that of the first embodiment is appropriately omitted.

As illustrated in FIGS. 3BP, 3BX, and 3BY, the dummy gate electrode 16 is formed on the fin region 13.

As illustrated in FIGS. 3CP, 3CX, and 3CY, a dummy insulating film 28 such as an oxide silicon film is deposited over the entire substrate, the surface of the dummy insulating film 28 is planarized by CMP, and the top portion of the dummy gate electrode 16 is exposed.

As illustrated in FIGS. 3DP, 3DX, and 3DY, the dummy gate electrode 16 is etched. A trench T is formed in the dummy insulating film 28.

As illustrated in FIGS. 3EP, 3EX, and 3EY, the gate electrode structure G including the gate insulator 21 and gate electrode 22 is formed in the trench T surrounded by the dummy insulating film 28.

As illustrated in FIGS. 3FP, 3FX, and 3FY, the dummy insulating film 28 is removed. The dummy insulating film 28 is etched using dilute hydrofluoric acid when the dummy insulating film is made of oxide silicon. The fin region 13 in which the gate electrode structure is formed is exposed. Ion implantation for the extension region is performed to the fin regions 13 on both sides of the gate electrode structure G.

As illustrated in FIGS. 3GP, 3GX, and 3GY, the sidewall spacer 18 is formed. Then ion implantation is performed to the low-resistance diffusion region Dif of the source/drain. After the ion implantation, spike annealing is performed at a temperature range of 1000° C. to 1100° C., for example, at 1050° C. to activate the impurity. The silicide layer SL may be formed.

As illustrated in FIGS. 3HP, 3HX, and 3HY, the insulating film 20 is deposited, and the insulating film 20 is planarized by CMP to expose the top portion of the gate electrode 22. Then, as illustrated in FIGS. 1HP, 1HX, and 1HY, the interlayer insulator forming process and the conductive plug forming process are performed to draw each electrode to the surface of the interlayer insulator.

In the second embodiment, the impurity implantation region and the silicide layer are not formed when the gate electrode is formed, thereby relaxing a temperature limitation of the subsequent heating process. For example, after the gate insulator is formed, the annealing may be performed at about 1000° C. for about five seconds to enhance quality of the gate insulator.

Figure 4A:
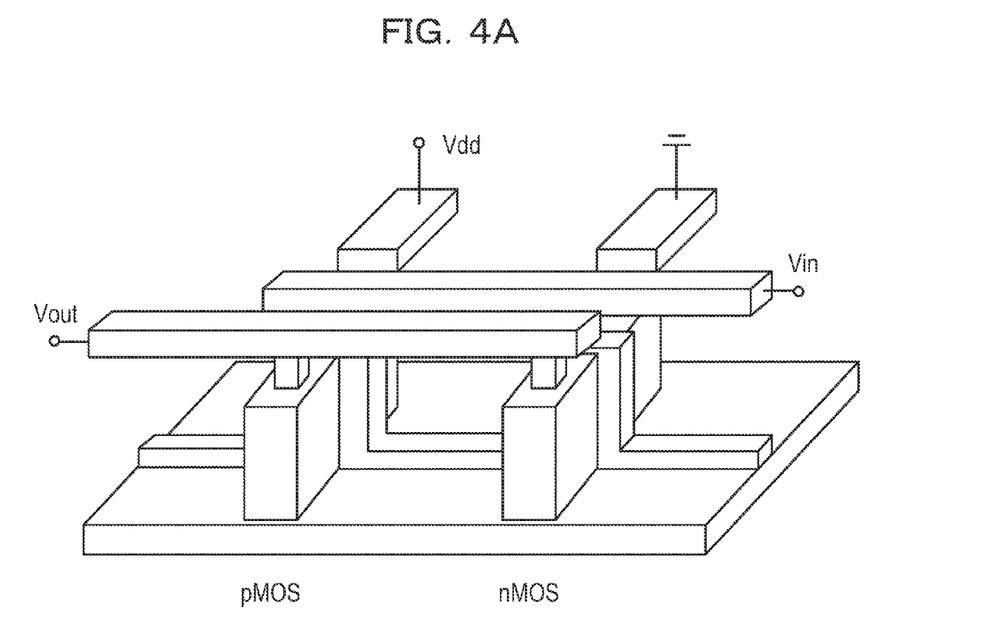
FIG. 4A is a perspective view illustrating a semiconductor device having a CMOS configuration.

FIG. 4A illustrates a configuration example of the fin FET. An n-channel MOS transistor nMOS and a p-channel MOS transistor pMOS basically have the structure of the first or second embodiment, and the transistor nMOS differs from the transistor pMOS in the conductivity type. The gate electrodes of the transistor nMOS and transistor pMOS are connected, and an input signal Vin is applied to the gate electrodes. The source of the transistor nMOS is grounded, and the source of the transistor pMOS is connected to a power supply voltage. The drains of the transistor nMOS and transistor pMOS are connected to supply an output voltage Vout.

Figure 4B:
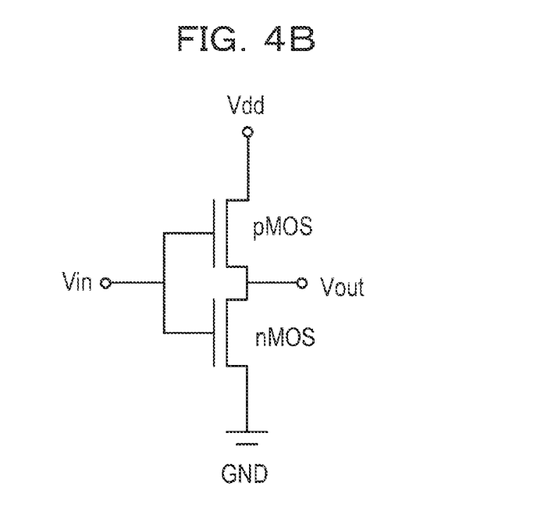
FIG. 4B is an equivalent circuit diagram.

FIG. 4B is an equivalent circuit diagram illustrating the fin FET of FIG. 4A. The nMOS transistor and the pMOS transistor are series-connected, and the gates of the nMOS transistor and pMOS transistor are connected to each other. The input signal Vin is fed into the gates, and the output is supplied from a mutual connecting point.

The embodiments of the invention have been described above, but the invention is not limited to the embodiments. For example, the gate electrode may be formed by laminating TaN, TaC, TaCN, TaCNO, TaSi, TaSiN, TaAlN, TiSi, TiAlN, MoN, or MoAlN and W or Si. The transistor nMOS may differ from the transistor pMOS in the material for the gate electrode. Instead of oxide silicon, a low-dielectric-constant insulating film having a dielectric constant lower than that of oxide silicon such as porous silica may be used as the insulating film.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that various changes, substitutions, and alterations could be made hereto without departing from the spirit and scope of the invention.

What is claimed is:

1. A semiconductor device manufacturing method comprising:
   forming a fin region over a substrate, the fin region having an apex portion and a sidewall portion and extending in a first direction;
   forming a dummy gate electrode over the fin region, the dummy gate electrode extending in a second direction different from the first direction;
   forming a first insulating film over the dummy gate electrode and the fin region;
   polishing the first insulating film until the dummy gate electrode is exposed;
   removing at least part of the exposed dummy gate electrode to form a trench, a surface of the fin region being exposed in the trench while leaving at least part of the dummy gate electrode positioned under the first insulating film and a second part of the dummy gate electrode at a bottom portion of the trench without removing;
   after removing the exposed dummy gate electrode, forming a gate insulator over the surface of the fin region exposed in the trench;
   depositing a gate electrode material over the gate insulator and over the first insulating film; and
   polishing the gate electrode material over the first insulating film until the first insulating film is exposed to form a gate electrode.

2. The semiconductor device manufacturing method according to claim 1, further comprising:
   forming an insulating cap layer before forming the dummy gate electrode, the apex portion of the fin region being covered with the insulating cap layer.

3. The semiconductor device manufacturing method according to claim 1, further comprising:
   implanting an impurity in the fin region using the dummy gate electrode as a mask to form a source/drain region.

4. The semiconductor device manufacturing method according to claim 3, wherein forming the source/drain region comprises:
   implanting a first impurity in the fin region using the dummy gate electrode as a mask;
   forming a sidewall spacer in the sidewall portion of the fin region after implanting the first impurity; and
   implanting a second impurity in the fin region using the dummy gate electrode and the sidewall spacer as masks.

5. The semiconductor device manufacturing method according to claim 3, further comprising:
   forming a silicide layer on a surface of the source/drain region.

6. The semiconductor device manufacturing method according to claim 1, wherein the dummy gate electrode includes nitride silicon.

7. The semiconductor device manufacturing method according to claim 1, wherein the gate electrode includes at least one of TiN and W.

8. The semiconductor device manufacturing method according to claim 1, wherein the substrate is a semiconductor on insulator substrate.

9. The semiconductor device manufacturing method according to claim 1, wherein the gate insulator is formed by laminating an oxide silicon film and an insulating film from at least one of the group consisting of a HfSiO film, a HfSiON film, a $HfO_2$ film, a HfAlO film, a HfAlON film, a $LaO_2$ film, a LaSiO film, and a LaAlO film.

* * * * *